United States Patent
Yang et al.

(10) Patent No.: US 10,872,893 B2
(45) Date of Patent: Dec. 22, 2020

(54) DUAL NITRIDE STRESSOR FOR SEMICONDUCTOR DEVICE AND METHOD OF MANUFACTURING

(71) Applicant: TAIWAN SEMICONDUCTOR MANUFACTURING CO., LTD., Hsinchu (TW)

(72) Inventors: Yu-Lin Yang, Hsinchu County (TW); Chia-Cheng Ho, Hsinchu (TW); Chih Chieh Yeh, Taipei (TW); Cheng-Yi Peng, Taipei (TW); Tsung-Lin Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/665,823

(22) Filed: Oct. 28, 2019

(65) Prior Publication Data

US 2020/0126988 A1    Apr. 23, 2020

Related U.S. Application Data

(62) Division of application No. 14/714,229, filed on May 15, 2015, now Pat. No. 10,483,262.

(51) Int. Cl.
*H01L 21/82* (2006.01)
*H01L 27/092* (2006.01)
(Continued)

(52) U.S. Cl.
CPC .. *H01L 27/0924* (2013.01); *H01L 21/823807* (2013.01); *H01L 21/823814* (2013.01); *H01L 21/823821* (2013.01); *H01L 29/66545* (2013.01); *H01L 29/66795* (2013.01); *H01L 29/7843* (2013.01); *H01L 29/7848* (2013.01); *H01L 29/165* (2013.01); *H01L 29/267* (2013.01)

(58) Field of Classification Search
None
See application file for complete search history.

(56) References Cited

U.S. PATENT DOCUMENTS 7,667,271 B2    2/2010    Yu et al.
8,362,575 B2    1/2013    Kwok et al.
(Continued)

FOREIGN PATENT DOCUMENTS

CN         104124165 A      10/2014
KR    10-2007-0101058 A    10/2007
(Continued)

OTHER PUBLICATIONS

Office Action Taiwanese Patent Application No. 10521164950 dated Sep. 21, 2016.
(Continued)

*Primary Examiner* — Joseph C. Nicely
*Assistant Examiner* — Lamont B Koo
(74) *Attorney, Agent, or Firm* — McDermott Will & Emery LLP

(57) ABSTRACT

A method for manufacturing a semiconductor device includes forming a fin structure over a substrate and forming a first gate structure over a first portion of the fin structure. A first nitride layer is formed over a second portion of the fin structure. The first nitride layer is exposed to ultraviolet radiation. Source/drain regions are formed at the second portion of the fin structure.

20 Claims, 14 Drawing Sheets

(51) Int. Cl.
*H01L 29/78* (2006.01)
*H01L 21/8238* (2006.01)
*H01L 29/66* (2006.01)
*H01L 29/165* (2006.01)
*H01L 29/267* (2006.01)

(56) References Cited

U.S. PATENT DOCUMENTS

| | | | |
|---|---|---|---|
| 8,367,498 | B2 | 2/2013 | Chang et al. |
| 8,440,517 | B2 | 5/2013 | Lin et al. |
| 8,497,528 | B2 | 7/2013 | Lee et al. |
| 8,610,240 | B2 | 12/2013 | Lee et al. |
| 8,680,576 | B2 | 3/2014 | Ching et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,785,285 | B2 | 7/2014 | Tsai et al. |
| 8,796,759 | B2 | 8/2014 | Perng et al. |
| 8,809,139 | B2 | 8/2014 | Huang et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 2006/0269693 | A1 | 11/2006 | Balseanu et al. |
| 2011/0068407 | A1 | 3/2011 | Yeh et al. |
| 2011/0278676 | A1 | 11/2011 | Cheng et al. |
| 2012/0091538 | A1 | 4/2012 | Lin et al. |
| 2013/0011983 | A1 | 1/2013 | Tsai et al. |
| 2013/0140639 | A1 | 6/2013 | Shieh et al. |
| 2014/0004713 | A1 | 1/2014 | Igeta et al. |
| 2014/0070318 | A1 | 3/2014 | Yu et al. |
| 2014/0217517 | A1 | 8/2014 | Cai et al. |
| 2014/0252412 | A1 | 9/2014 | Tsai et al. |
| 2015/0044831 | A1 | 2/2015 | Tung et al. |
| 2016/0043082 | A1 | 2/2016 | Greene et al. |
| 2016/0049467 | A1 | 2/2016 | Wu et al. |
| 2016/0268257 | A1 | 9/2016 | Lim et al. |

FOREIGN PATENT DOCUMENTS

| | | |
|---|---|---|
| KR | 10-0036372 A | 11/2012 |
| KR | 10-2013-0061616 A | 6/2013 |
| TW | 200620560 A | 6/2006 |
| TW | 200822225 A | 5/2008 |
| TW | 201340312 A | 10/2013 |

OTHER PUBLICATIONS

Office Action Korean Patent Application No. 10-2015-0163213 dated Dec. 1, 2016.
Office Action issued in corresponding Taiwanese Patent Application No. 10620938170, dated Jul. 12, 2017.
Non-final Office Action issued in related U.S. Appl. No. 14/714,229, dated Jun. 1, 2016.
Non-final Office Action issued in related U.S. Appl. No. 14/714,229, dated Feb. 28, 2017.
Non-final Office Action issued in related U.S. Appl. No. 14/714,229, dated Sep. 22, 2017.
Non-final Office Action issued in related U.S. Appl. No. 14/714,229, dated Jun. 15, 2018.
Non-final Office Action issued in related U.S. Appl. No. 14/714,229, dated Jan. 24, 2019.
Final Office Action issued in related U.S. Appl. No. 14/714,229, dated Nov. 4, 2016.
Final Office Action issued in related U.S. Appl. No. 14/714,229, dated Jun. 15, 2017.
Final Office Action issued in related U.S. Appl. No. 14/714,229, dated Feb. 8, 2018.
Notice of Allowance issued in related U.S. Appl. No. 14/714,229, dated Jul. 16, 2019.

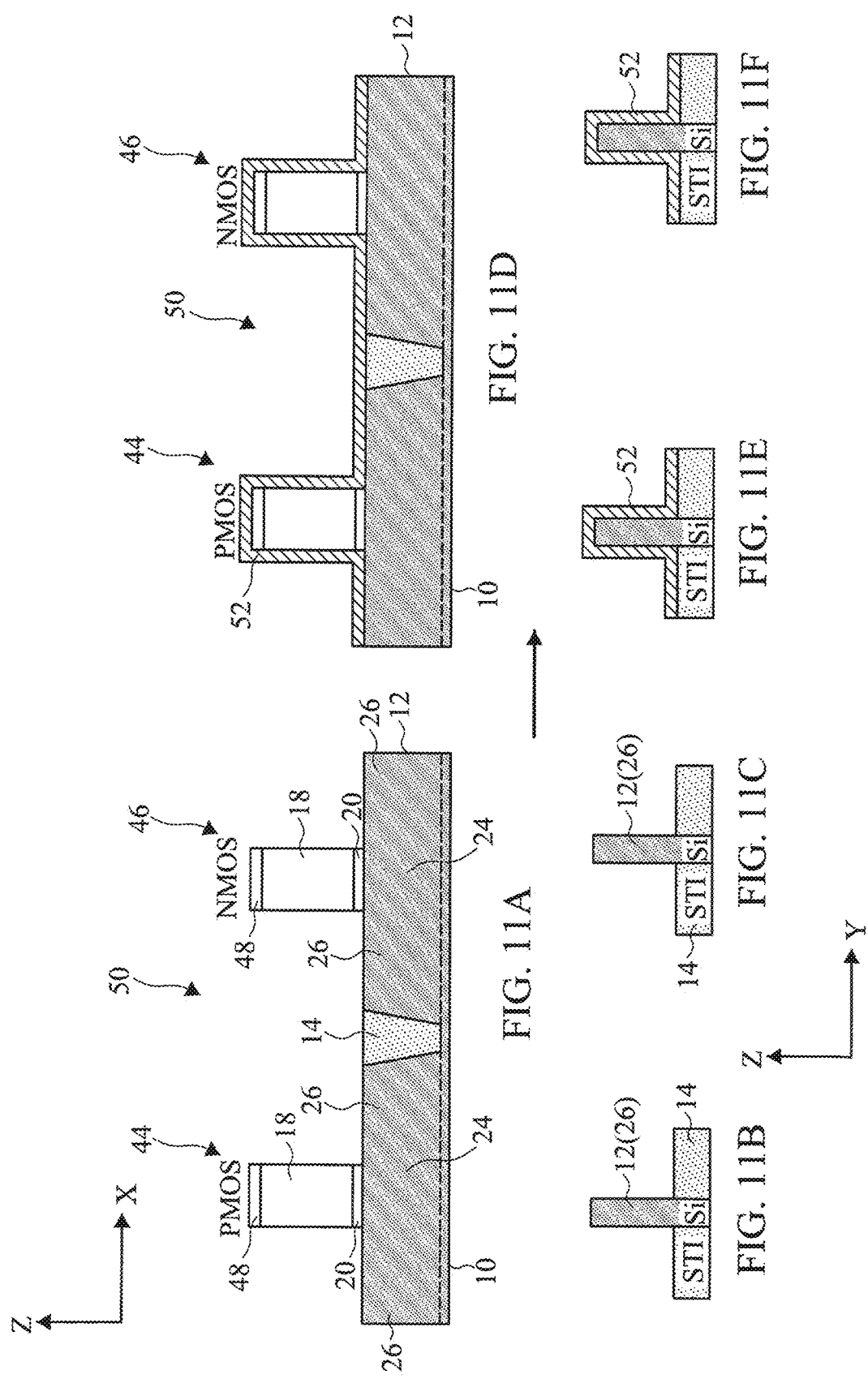

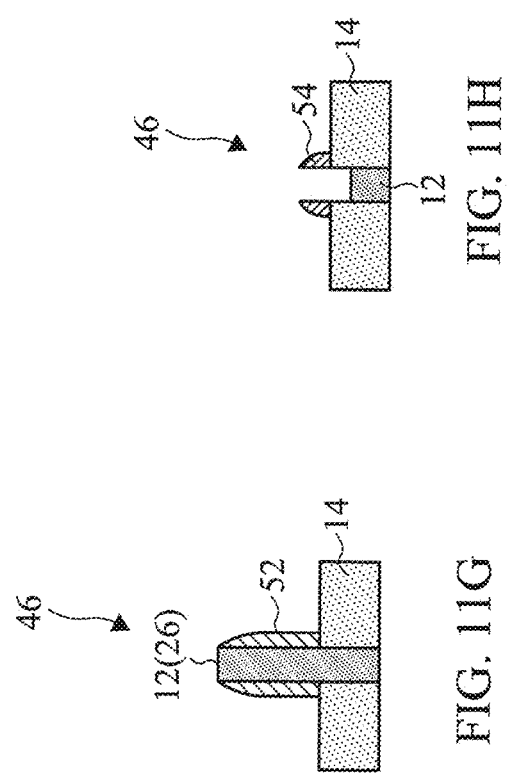

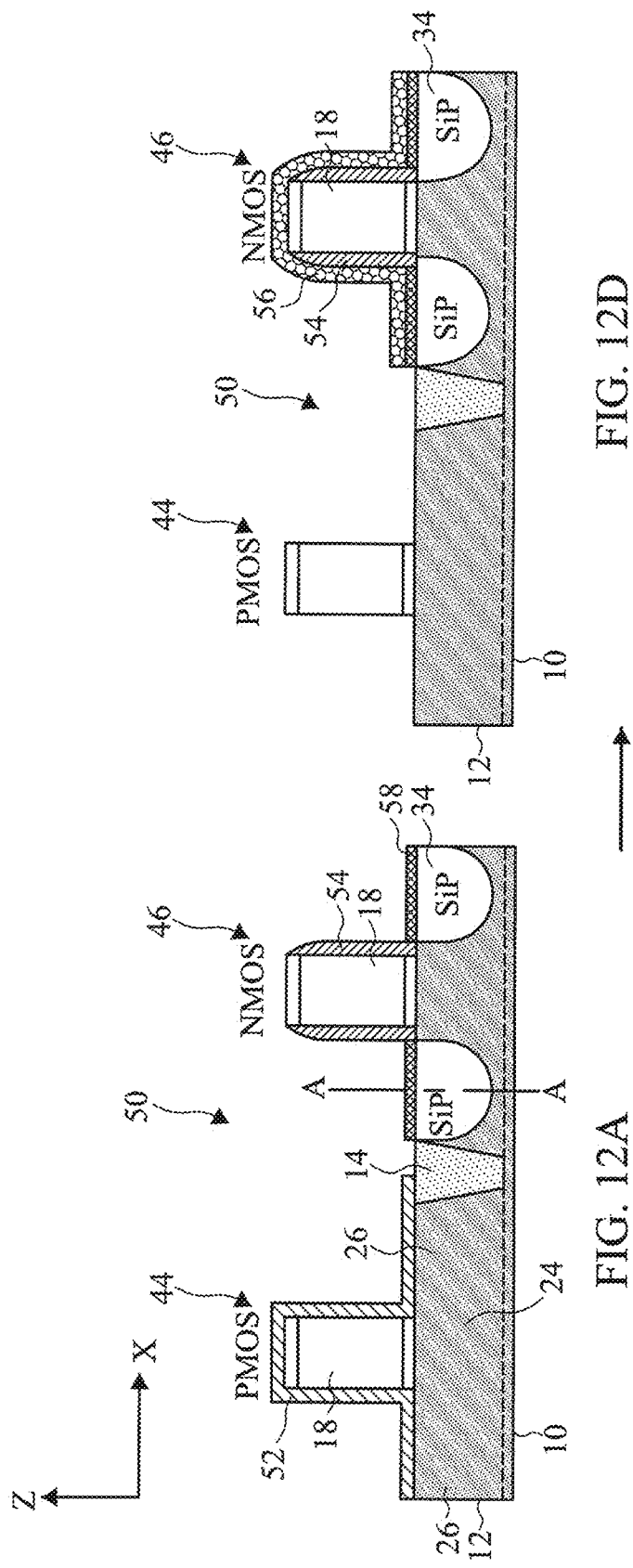

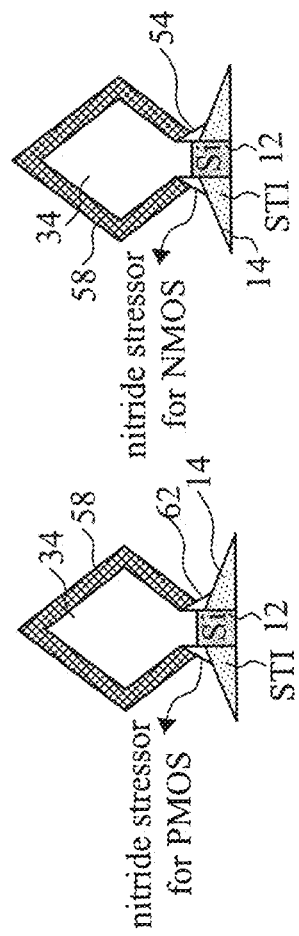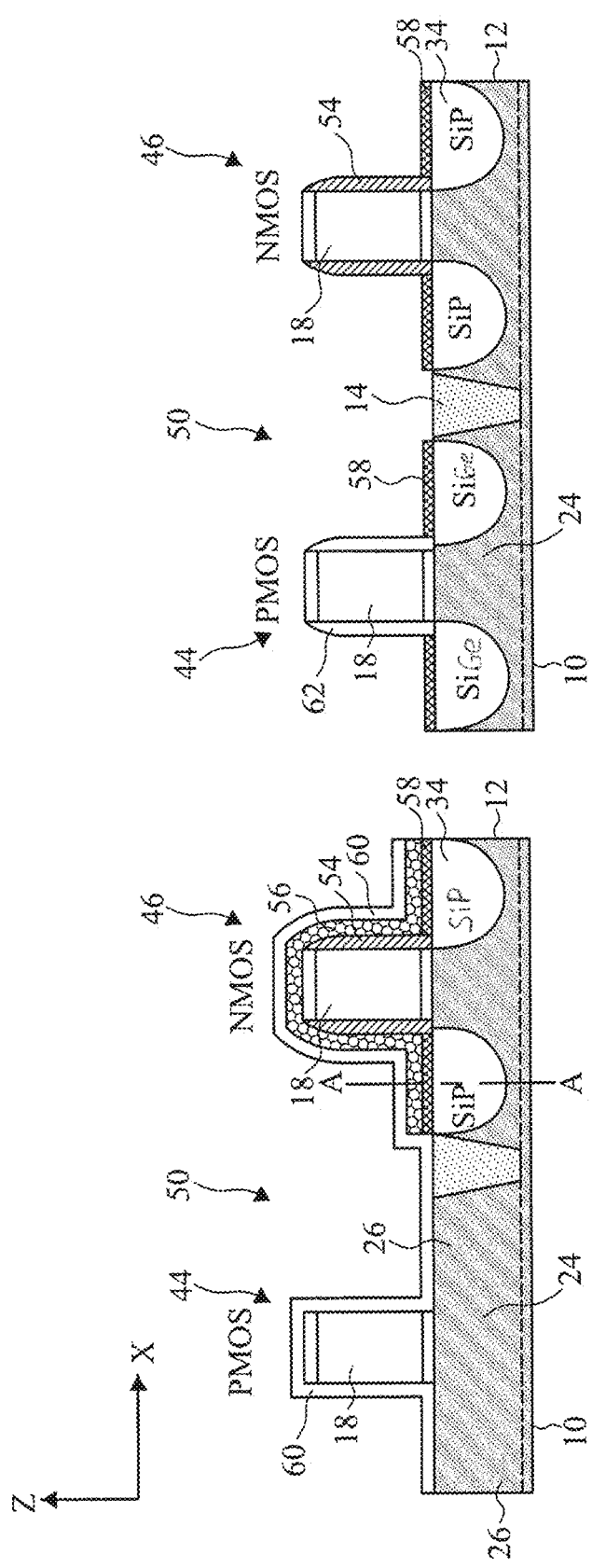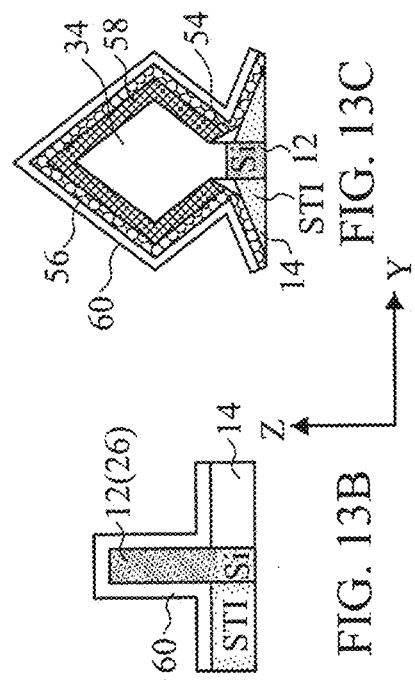

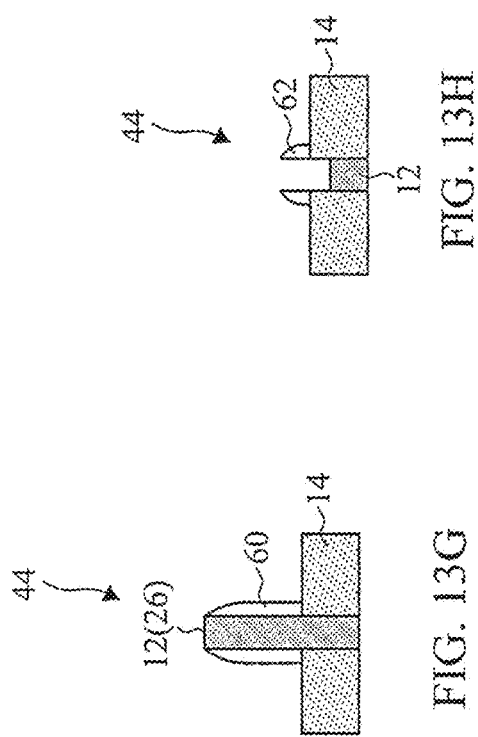

US 10,872,893 B2

DUAL NITRIDE STRESSOR FOR SEMICONDUCTOR DEVICE AND METHOD OF MANUFACTURING

CROSS-REFERENCE TO RELATED APPLICATIONS

This application is a divisional of U.S. patent application Ser. No. 14/714,229, filed May 15, 2015, now U.S. Pat. No. 10,483,262, the entire disclosure of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon phosphide (SiP) or silicon carbide (SiC), may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 11A, 11B, 11C, 11D, 11E, 11F, 11G, 11H, 12A, 12B, 12C, 12C, 12D, 12E, 12F, 13A, 13B, 13C, 13D, 13E, 13F, 13G and 13H show an exemplary process for manufacturing a semiconductor Fin FET device according to another embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Examples of devices that can benefit from one or more embodiments of the present disclosure are semiconductor devices. Such a device, for example, is a Fin FET device. The Fin FET device, for example, may be a complementary metal-oxide-semiconductor (CMOS) device comprising a P-type metal-oxide-semiconductor (PMOS) Fin FET device and an N-type metal-oxide-semiconductor (NMOS) Fin FET device. The following disclosure will include a Fin FET example to illustrate various embodiments of the present application. It is understood, however, that the application should not be limited to a particular type of device, except as specifically claimed.

Figure 1:
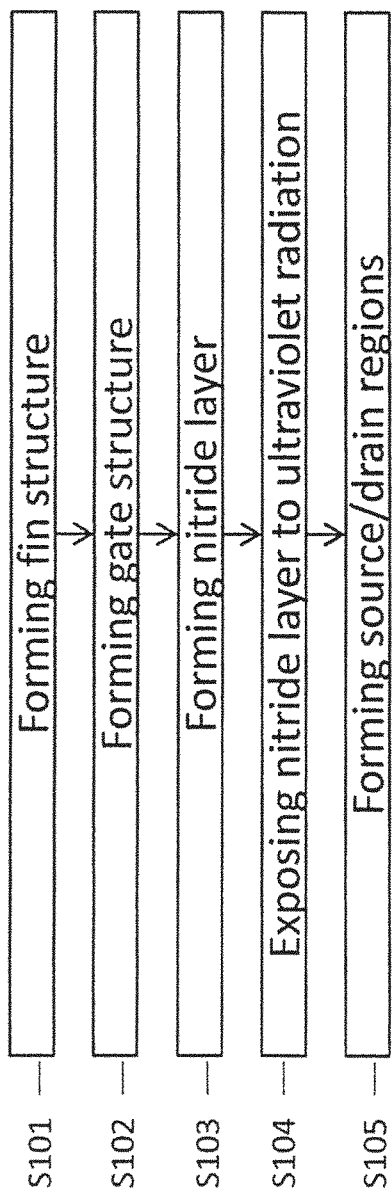
FIG. 1 is an exemplary process flow chart for manufacturing a semiconductor FET device having a fin structure (Fin FET) according to an embodiment of the present disclosure.

An exemplary method for manufacturing a semiconductor FET device having a fin structure (Fin FET) according to an embodiment of the present disclosure is illustrated in FIG. 1. An exemplary method includes the operations S101 of forming a fin structure on a substrate and S102 forming a gate structure overlying the fin structure. Operations S103 of forming a nitride layer and S104 exposing the nitride layer to ultraviolet radiation are subsequently performed. An operation S105 of forming source/drain regions is then performed.

Figure 2:
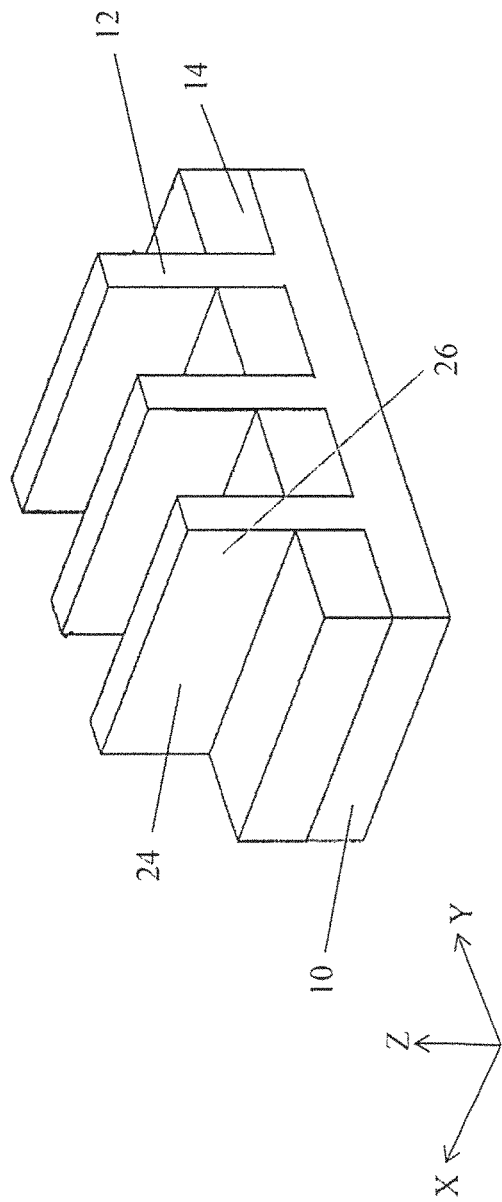
FIGS. 2, 3, 4, 5, 6, 7A, 7B, and 8 show an exemplary process for manufacturing a semiconductor Fin FET device according to one embodiment of the present disclosure.

According to an embodiment of the disclosure, a method for manufacturing a semiconductor device includes forming a fin structure comprising one or more fins 12 over a semiconductor substrate 10, as shown in FIG. 2. In one embodiment, the semiconductor substrate 10 is a silicon substrate. Alternatively, the semiconductor substrate 10 may include germanium, silicon germanium, gallium arsenide or other appropriate semiconductor materials. Also alternatively, the semiconductor substrate may include an epitaxial layer. For example, the semiconductor substrate may have an epitaxial layer overlying a bulk semiconductor. Further, the semiconductor substrate may be strained for performance enhancement. For example, the epitaxial layer may include a semiconductor material different from that of the bulk semiconductor, such as a layer of silicon germanium overlying bulk silicon or a layer of silicon overlying bulk silicon germanium. Such strained substrates may be formed by selective epitaxial growth (SEG). Furthermore, the semiconductor substrate may include a semiconductor-on-insulator (SOI) structure. Also alternatively, the semiconductor substrate may include a buried dielectric layer, such as a buried oxide (BOX) layer, such as that formed by separation by implantation of oxygen (SIMOX) technology, wafer bonding, SEG, or other appropriate method. In other embodiments, the substrate may comprise a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof.

Fins 12 are disposed over the semiconductor substrate 10 and the fin 12 may be made of the same material as the semiconductor substrate 10 and may continuously extend from the semiconductor substrate 10. The fins 12 may be formed by selectively etching the semiconductor substrate 10. Alternatively, the fins 12 may be formed using an EPI first method. In the EPI first methods, an epitaxial layer is formed on the semiconductor substrate 10, and then the epitaxial layer is subsequently patterned to form fins 12.

A photolithography process can be used to define fins 12 on the semiconductor substrate 10. In some embodiments, a hard mask layer is formed on the semiconductor substrate 10. The hard mask layer may comprise a bilayer of SiN and $SiO_2$. A photoresist layer is spin-on coated on semiconductor substrate. The photoresist is patterned by selective exposure of the photoresist to actinic radiation. Generally, patterning may include photoresist coating (e.g., spin-on coating), soft baking, mask aligning, exposing, post-exposure baking, developing the photoresist, rinsing, drying (e.g., hard baking), other suitable processes, or combinations thereof. Alternatively, the photolithography exposing process is implemented or replaced by other proper methods such as maskless photolithography, electron-beam writing, direct-writing, ion-beam writing, and/or nano-imprinting.

The pattern of the photoresist layer is subsequently transferred into the hard mask layer by etching the exposed area of the hard mask layer. The hard mask layer is subsequently used as a mask during etching of the semiconductor substrate. The semiconductor substrate may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_4F_8$), chlorine-containing gas (e.g., $Cl_2$, $CHCl_3$, $CCl_4$, and/or $BCl_3$), bromine-containing gas (e.g., HBr and/or $CHBr_3$), oxygen-containing gas, iodine-containing gas, other suitable gases and/or plasmas, or combinations thereof. The etching process may include a multiple-step etching to gain etch selectivity, flexibility and desired etch profile.

In certain embodiments, the semiconductor device includes an insulating material formed over the semiconductor substrate 10 along lower portions of the fin 12. The insulating material may be deposited when forming shallow trench isolation (STI) regions 14 between a plurality of fins in embodiments comprising a plurality of fins. The STI regions 14 may comprise silicon oxide, silicon nitride, silicon oxynitride, other suitable materials, and combinations thereof. STI regions 14 may be formed by any suitable process. As one embodiment, the STI regions 14 are formed by filling the region between fins with one or more dielectric materials by using chemical vapor deposition (CVD). In some embodiments, the filled region may have a multi-layer structure such as a thermal oxide liner layer filled with silicon nitride or silicon oxide. An annealing process may be performed after the formation of the STI region. The annealing process includes rapid thermal annealing (RTA), laser annealing processes, or other suitable annealing processes.

In some embodiments, the STI regions 14 are formed using flowable CVD. In flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once at temperatures, such as in a range from about 1000° C. to about 1200° C., and for an extended period, such as 30 hours or more in total.

A chemical mechanical polishing (CMP) operation is performed to remove excess material from the STI region and to provide a substantially planar surface. Dopant is subsequently implanted into the fins to form n and p wells and then the device is subsequently annealed. The STI region is etched back to remove a portion of the STI region and expose the upper portions of the fins where the gate structure, and source/drain regions are subsequently formed. The formation of the gate electrode structure may include additional depositing, patterning, and etching processes. The STI removal is performed by a suitable etching process, such as a semi-isotropic etch using $HF+NH_3$ without plasma or $NF_3+NH_3$ with plasma; or an isotropic etch, such as dilute HF.

Figure 3:
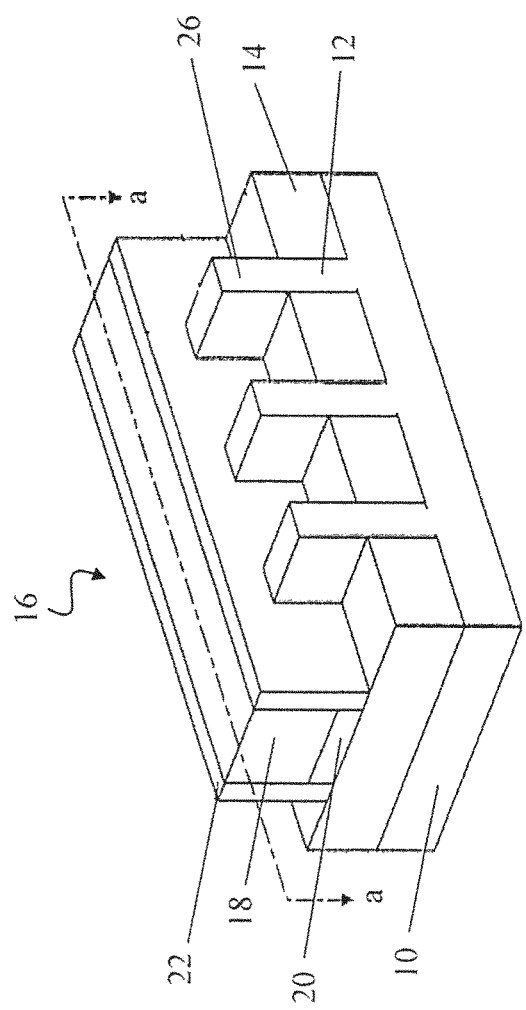
Figure 4:
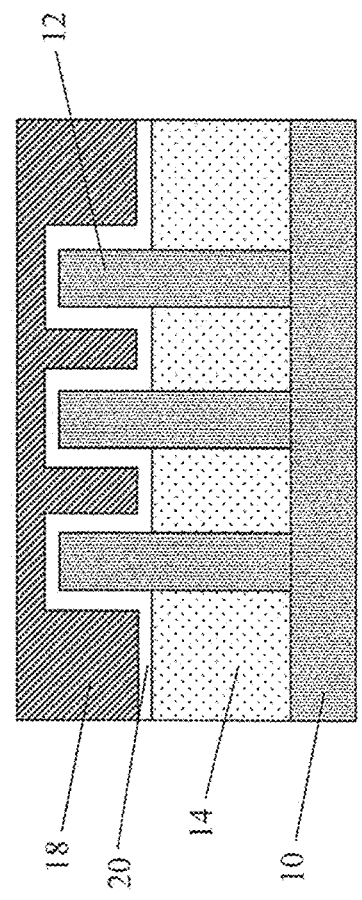

In certain embodiments, a gate structure 16 is formed over a first portion 24 of the fin structure, as shown in FIG. 3. The gate structure formation process may include the operations of depositing a gate dielectric 20, depositing a gate electrode 18, patterning the gate, lightly doped drain (LDD) implantation, and annealing. Sidewall spacers 22 are subsequently formed on the gate structure 16, and source/drain implantation and annealing is performed. FIG. 4 is a cross section taken along line a-a of FIG. 3, showing the arrangement of the fins 12 and the gate electrode structure 16.

The gate dielectric 20 may comprise silicon oxide, silicon nitride, silicon oxynitride, high-k dielectric material, other suitable dielectric material, and/or combinations thereof. The gate electrode 18 in certain embodiments is formed of polysilicon and may include a hard mask formed over the gate electrode. The hard mask may be made a suitable hard mask material, including $SiO_2$, SiN, or SiCN. The gate electrode structure may comprise additional layers such as interfacial layers, capping layers, diffusion/barrier layers, dielectric layers, conductive layers, and other suitable layers, and combinations thereof. In addition to polysilicon, the gate electrode 18 may comprise any other suitable material, such as aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

In certain embodiments, the Fin FET can be fabricated using a gate first method or a gate last method. In embodiments using a high-k dielectric and a metal gate (HK/MG), a gate last method is employed to form the gate electrode. In the gate last method, a dummy gate is formed, the dummy gate is subsequently removed at a later operation after a high temperature annealing operation, and the high k dielectric and a metal gate (HK/MG) is formed.

According to embodiments of the disclosure, the high k gate dielectric 20 may comprise $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate material may comprise one or more layers of Ti, TiN, titanium-aluminum alloy, Al, AlN, Ta, TaN, TaC, TaCN, TaSi, and the like.

In some embodiments, the sidewall spacers 22 are used to offset subsequently formed doped regions, such as source/drain regions. The sidewall spacers 22 may further be used for designing or modifying the source/drain region (junction) profile. The sidewall spacers 22 may be formed by suitable deposition and etch techniques, and may comprise silicon nitride, silicon carbide, silicon oxynitride, other suitable materials, or combinations thereof.

Figure 5:
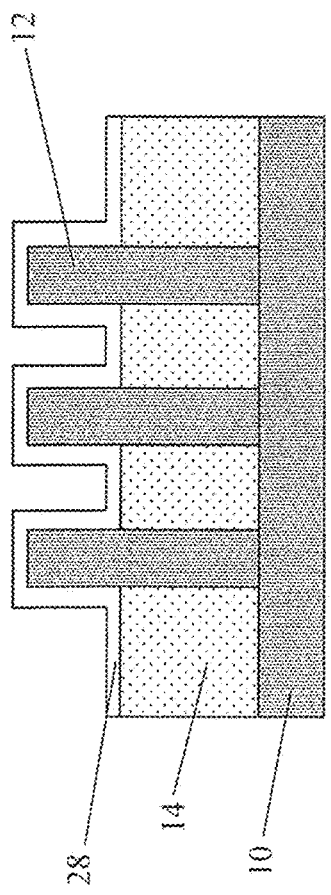

Adverting to FIG. 5, a nitride 28 layer is deposited over the exposed second portion 26 (see FIG. 3) of the fin 12 where the gate electrode structure 16 and sidewall spacers 22 are not formed. The nitride layer 28 can be a silicon nitride layer. Any suitable technique for depositing silicon nitride, including CVD can be used to deposit the nitride layer 28. The nitride layer may be silicon nitride, silicon oxynitride, carbon-doped silicon nitride, carbon-doped silicon oxynitride, boron nitride, or boron carbon nitride in certain embodiments.

Figure 6:
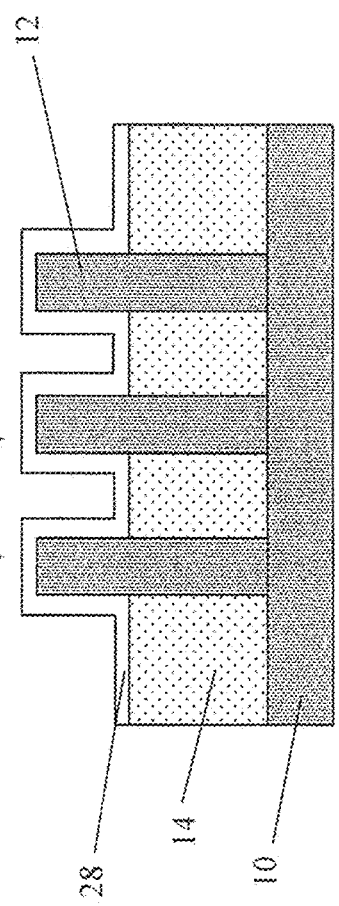

The nitride layer 28 is subsequently exposed to ultraviolet radiation 30 for a period of time from about 1 second to about 2 hours, as shown in FIG. 6. The length of time of the ultraviolet radiation exposure can vary depending on the nitride layer thickness. In some embodiments, the nitride layer 28 is exposed to ultraviolet radiation 30 for about 30 seconds to about 1 hour. In other embodiments, the nitride layer 28 is exposed to ultraviolet radiation 30 for about 2 minutes to about 15 minutes.

The nitride layer 28 is exposed to ultraviolet radiation 30 having a wavelength of less than about 400 nm. In some embodiments the ultraviolet radiation 30 has a wavelength of less than 200 nm.

In certain embodiments, the device is heated during the exposure to ultraviolet radiation. The device may be heated to a temperature of about 200° C. to about 600° C. In certain embodiments, the device is heated to a temperature of about 300° C. to about 500° C. during irradiation. In other embodiments, the device is heated to a temperature of about 380° C. to about 480° C. during ultraviolet irradiation.

Figure 7A:
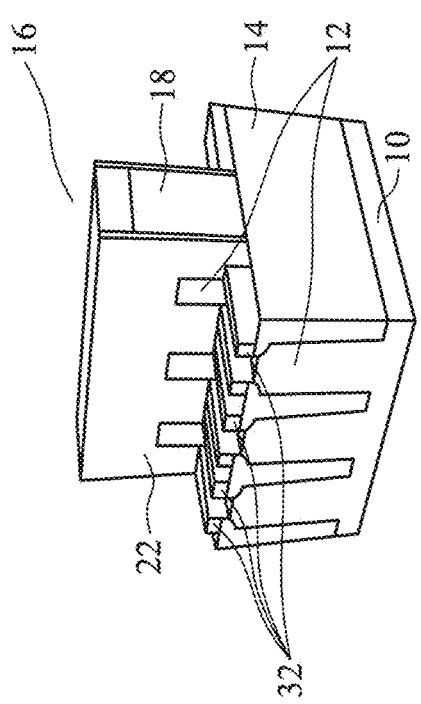
Figure 7B:
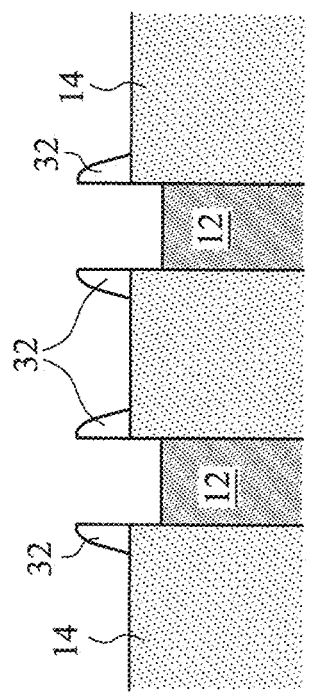

A part of the second portion 26 of the fins covered with the nitride layer 28 are subsequently etched to remove the portion of the fins above the STI region 14, as shown in FIG. 7A. Suitable photolithographic and etching techniques can be used to remove the second portion 26 of the fins. After the etching operation, nitride residues 32 remain on the STI region 14. A detailed view of the nitride residues 32 remaining on the STI regions 14 and etched fins 12 is shown in FIG. 7B.

Figure 8:
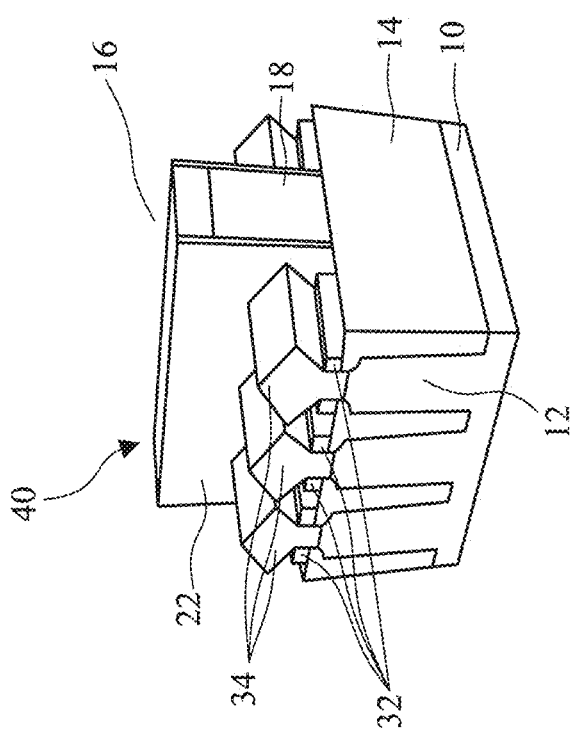

In certain embodiments, raised source/drain regions 34 are subsequently formed overlying the etched portion of the fins 12, as shown in FIG. 8, providing a Fin FET semiconductor device 40. The raised source/drain regions may be formed by one or more epitaxy or epitaxial (epi) processes, such that Si features, SiC features, SiGe features, SiP features, SiCP features, or Group III-V semiconductor material on Si EPI or other suitable features are formed in a crystalline state on the fins. The epitaxy processes include CVD deposition techniques (e.g., vapor-phase epitaxy (VPE) and/or ultra-high vacuum CVD (UHV-CVD)), molecular beam epitaxy, and/or other suitable processes.

In some embodiments of the disclosure, source/drain electrodes are formed contacting the respective source/drain regions. The electrodes may be formed of a suitable conductive material, such as copper, tungsten, nickel, titanium, or the like. In some embodiments, a metal silicide is formed at the conductive material and source/drain interface to improve conductivity at the interface. In one example, a damascene and/or dual damascene process is used to form copper-based multilayer interconnection structures. In another embodiment, tungsten is used to form tungsten plugs.

Subsequent processing according to embodiments of the disclosure may also form various contacts/vias/lines and multilayer interconnects features (e.g., metal layers and interlayer dielectrics) on the semiconductor substrate, configured to connect the various features or structures of the Fin FET device. For example, a multilayer interconnection includes vertical interconnects, such as conventional vias or contacts, and horizontal interconnects, such as metal lines.

Figure 9:
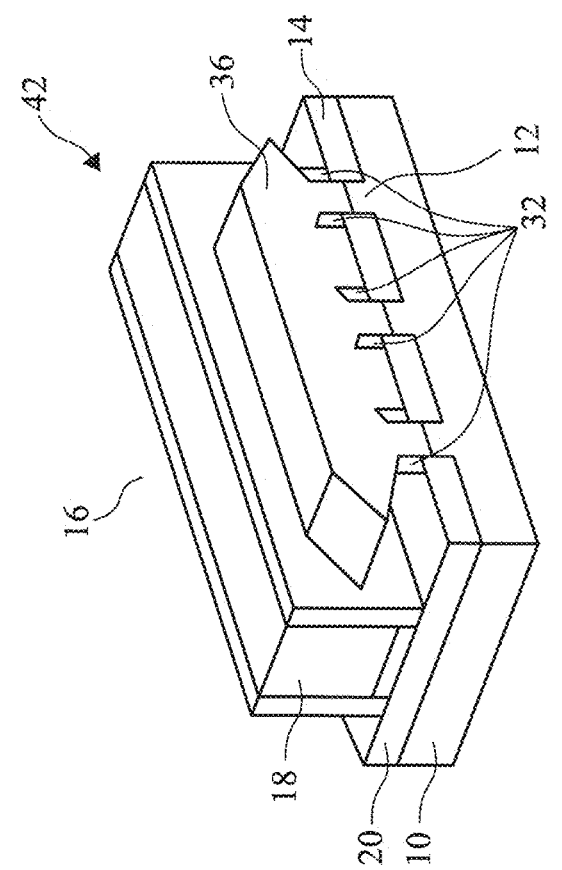
FIG. 9 shows a semiconductor Fin FET device according to another embodiment of the present disclosure.

In certain embodiments, the epitaxial growth of the source/drain regions is continued until the individual source/drain regions merge together to form a Fin FET semiconductor device 42 with merged source/drain regions 36, as shown in FIG. 9.

Figure 10:
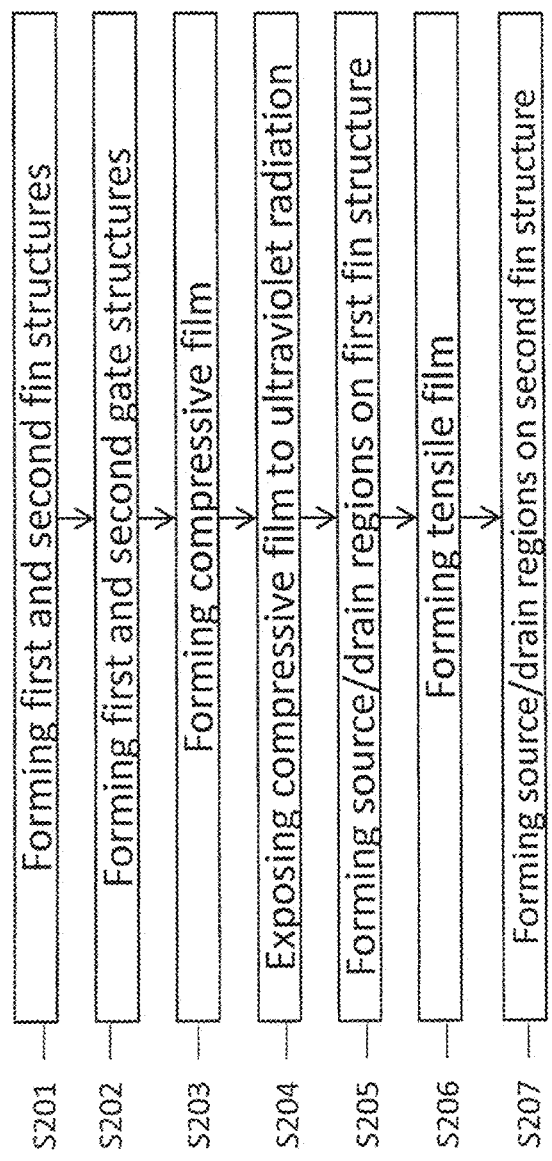
FIG. 10 is an exemplary process flow chart for manufacturing a semiconductor FET device having a fin structure according to another embodiment of the present disclosure.

FIG. 10 illustrates another method for manufacturing a semiconductor FET device having a fin structure, according to an embodiment of the disclosure. The method includes operations S201 of forming first and second fin structures and S202 forming first and second gate structures. An operation S203 of forming a compressive film on the semiconductor device is followed by an operation S204 of exposing the compressive film to ultraviolet radiation. In operation S205 source/drain regions are formed on the first fin structure. A tensile film is subsequently formed on the semiconductor device in operation S206. Source/drain regions are subsequently formed on the second fin structure in operation S207.

In some embodiments of the disclosure, a Fin FET semiconductor device 50 includes PMOS and NMOS regions. As shown in FIG. 11A, PMOS 44 and NMOS 46 regions are formed on a semiconductor substrate 10. The PMOS 44 and NMOS 46 regions are separated by an STI region 14. FIG. 11A illustrates a cross section taken along the x direction across the gate structures of the PMOS and NMOS. As shown in FIGS. 11A and 11D, the gate electrodes 18 overly the first portion 24 of the fin. A capping layer 48 overlies the gate electrodes 18 in some embodiments. The capping layer 48 may be formed of a silicon nitride. FIGS. 11B and 11C are cross sections of the fins 12 taken along the y direction at the PMOS and NMOS, respectively. FIGS. 11B and 11C correspond to the second portions 26 of the fin.

In FIG. 11D a compressive film 52 is formed overlying the semiconductor device 50. The compressive film 52 is a nitride layer in some embodiments of the disclosure. The nitride layer 52 is silicon nitride, silicon oxynitride, carbon-doped silicon nitride, carbon-doped silicon oxynitride, boron nitride, or boron carbon nitride in certain embodiments. FIGS. 11E and 11F are cross sections showing the compressive film 52 formed over the fins 12 in the PMOS and NMOS, respectively. The compressive film 52 provides a tensile stress in the channel of the NMOS.

Adverting to FIG. 11G, portions of the compressive film 52 are removed from the semiconductor device 50 at the NMOS region 46. Etching is used to remove the compressive film 52 in this embodiment. The second portion 26 of fin in the NMOS region 46 is subsequently etched leaving a residue 54 of the compressive film and a recessed fin 12 in certain embodiments, as shown in FIG. 11H.

Source/drain regions 34 are formed in the NMOS region 46 in the regions where the compressive film was removed, and contact layer 58 is formed overlying the source/drain regions 34, as shown in FIG. 12A. FIG. 12A is a cross section taken along the x direction across the gate structures of the PMOS and NMOS. In certain embodiments, the source/drain regions 34 is formed of SiP. The contact layer 58 is formed of a conductive material, such as a silicide, in certain embodiments. The compressive residue 54 acts as a stressor film, imparting a stress on the source/drain region 34. Cross sections showing the compressive film 52 on the fin 12 in PMOS region and the source/drain regions 34 formed on fin 12 in the NMOS region are shown in FIGS. 12B and 12C. FIG. 12C is a cross section taken along line A-A in FIG. 12A.

In some embodiments, forming a compressive film may use a multi-layer deposition (MLD), such as by depositing a nitride layer, $Si_xN_y$ or $Si_xN_y$:H, for example. Each layer thickness may be in a range of about 20 to 100 Å. After depositing the nitride layer to a total thickness of 300 to 1000 Å, plasma treatment may be performed to break Si—N and N—H bonds to form a compressive film with a compressive stress of about −1 to about −2 GPa.

The compressive film 52 can alternatively be formed by ultraviolet assisted thermal processing (UVTP), by exposing the nitride layer to ultraviolet radiation. In UVTP, the nitride layer is deposited to a thickness of about 300 to 1000 Å by PECVD or LPCVD, and then the nitride layer is exposed to ultraviolet radiation, at a wavelength of less than 400 nm for a period of time of about 1 second to about 2 hours. The length of time of the ultraviolet radiation exposure can vary depending on the nitride layer thickness. In some embodiments, the compressive film 52 is exposed to ultraviolet radiation for about 30 seconds to about 1 hour to break Si—N and N—H bonds. In other embodiments, the compressive film 52 is exposed to ultraviolet radiation for about 3 minutes to about 20 minutes.

In some embodiments the ultraviolet radiation has a wavelength of less than 200 nm.

In certain embodiments, the device is heated during the exposure to ultraviolet radiation. The device may be heated to a temperature of about 200° C. to about 600° C. In certain embodiments, the device is heated to a temperature of about 300° C. to about 500° C. during irradiation. In other embodiments, the device is heated to a temperature of about 380° C. to about 480° C. during ultraviolet irradiation.

As shown in FIG. 12D, after forming the source/drain regions 34 in the NMOS region 46, a dummy layer 56 is formed overlying the NMOS region 46. The dummy layer 56 protects the NMOS region 46 during subsequent processing of the PMOS region 44. The compressive film 52 is removed from the PMOS region 44. The compressive film 52 can be removed from the PMOS region 44 by etching. A cross section of the fin 12 with the compressive film removed in the PMOS region 44 is shown in FIG. 12E and a cross section of the fin 12 with the overlying source/drain region 34 and dummy film 56 is shown in FIG. 12F.

Adverting to FIG. 13A, a tensile film 60 is formed over the semiconductor device 50 after formation of the dummy layer 56 on the NMOS region 46 and removal of the compressive film 52 from the PMOS region 44. The tensile film 60 introduces a compressive stress into the channel of the PMOS region 44 in certain embodiments.

To form a tensile film, a gas such as Ar, $N_2$, Kr, Xe, or mixtures thereof, is added during a CVD process of forming the nitride layer. For example, Ar may be used as the gas, and the Ar may be introduced at a flow rate of about 100 sccm to about 500 sccm, and RF power used in the CVD process is about 50 to 3000 W, thereby providing a tensile film with a tensile stress of about 0.7 to about 2 GPa.

Cross sections of the fins 12 of the PMOS region 44 and the NMOS 46 region showing the overlying tensile film 60, are shown in FIGS. 13B and 13C, respectively.

The tensile film 60 is subsequently removed from the PMOS region 44 leaving behind a tensile film residue 62. The tensile film residue 62 introduces a stress in the source/drain regions 34 subsequently formed overlying the fin 12 of the PMOS region, as illustrated in FIG. 13D. In certain embodiments, the source/drain regions 34 formed in the PMOS region 44 are formed of SiGe. A contact layer 58 is subsequently formed over the source/drain regions 34 in the PMOS region 44. The tensile film 60 and the dummy film 56 are removed from the NMOS region 46 to provide the semiconductor device 50. Cross section views of the semiconductor device 50 show the fins 12 of the PMOS region 44 and NMOS region 46 with respective source/drain regions 34 are shown in FIGS. 13E and 13F, respectively.

FIGS. 13G and 13H depict intermediate steps in forming source/drain regions 34 in the PMOS region 44 as shown in FIG. 13E from the structure shown in FIG. 13B. Portions of the tensile film 60 are removed from the semiconductor device 50 at the PMOS region 44. The tensile film 52 is removed by etching in this embodiment. The second portion 26 of fin in the PMOS region 44 is subsequently etched leaving a residue 62 of the tensile film and a recessed fin 12 in certain embodiments, as shown in FIG. 13H.

Figure 14:
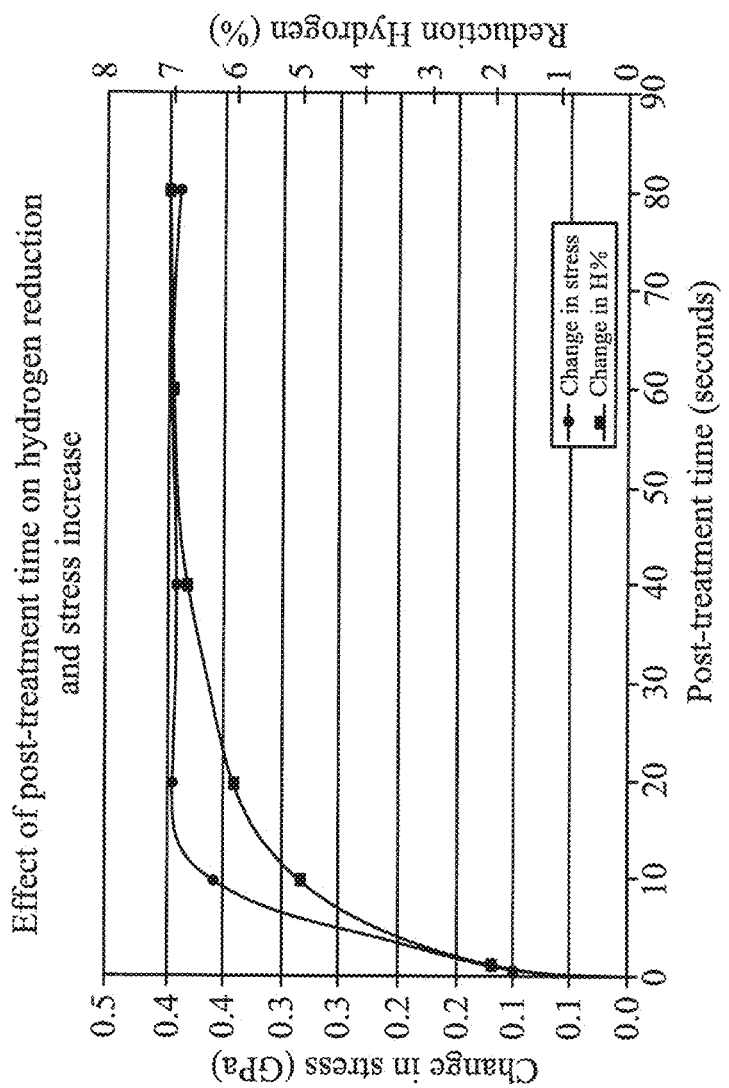
FIG. 14 shows the effect of post-treatment time on hydrogen reduction and stress increase according to an embodiment of the present disclosure.

The length of time of ultraviolet radiation exposure, the layer thickness, and the temperature during ultraviolet radiation exposure affect stress generated in the compressive film. For example, as shown in one embodiment of the disclosure, the effect of the time of exposure to ultraviolet radiation (post-treatment) on the increase of stress and on reduction of hydrogen is shown in FIG. 14. Exposure of the compressive film to ultraviolet radiation results in the breaking of Si—H and N—H bonds.

Figure 15:
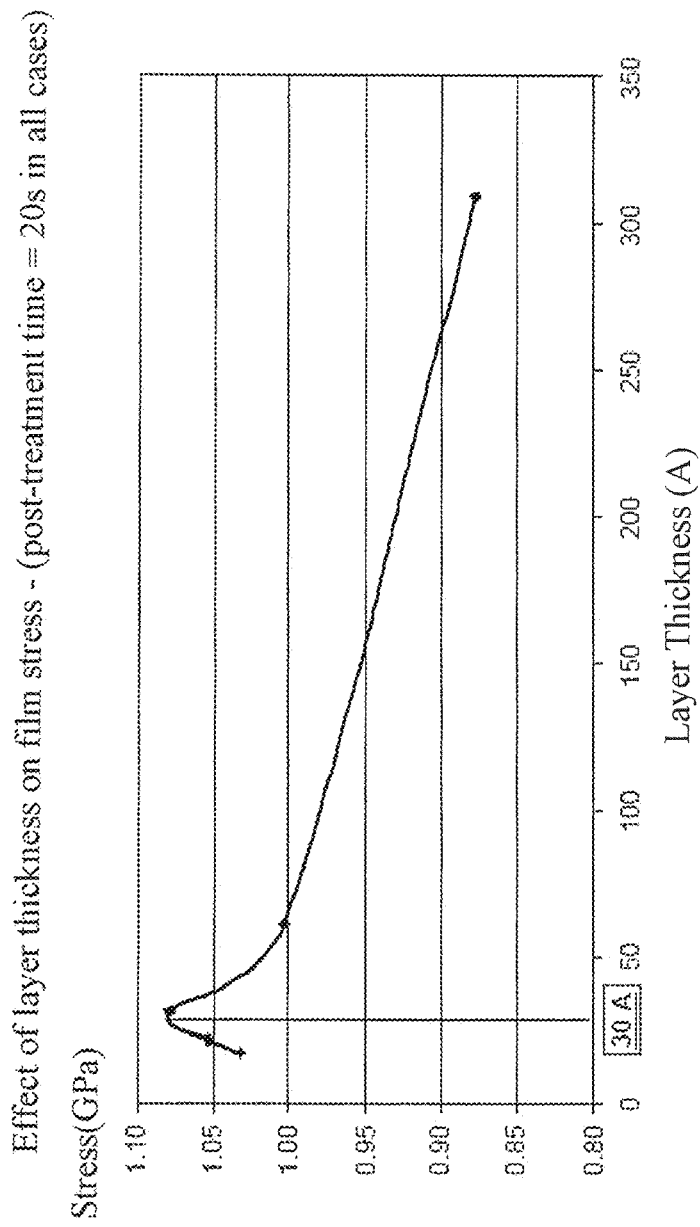
FIG. 15 shows the effect of layer thickness on film stress according to an embodiment of the present disclosure.
Figure 16:
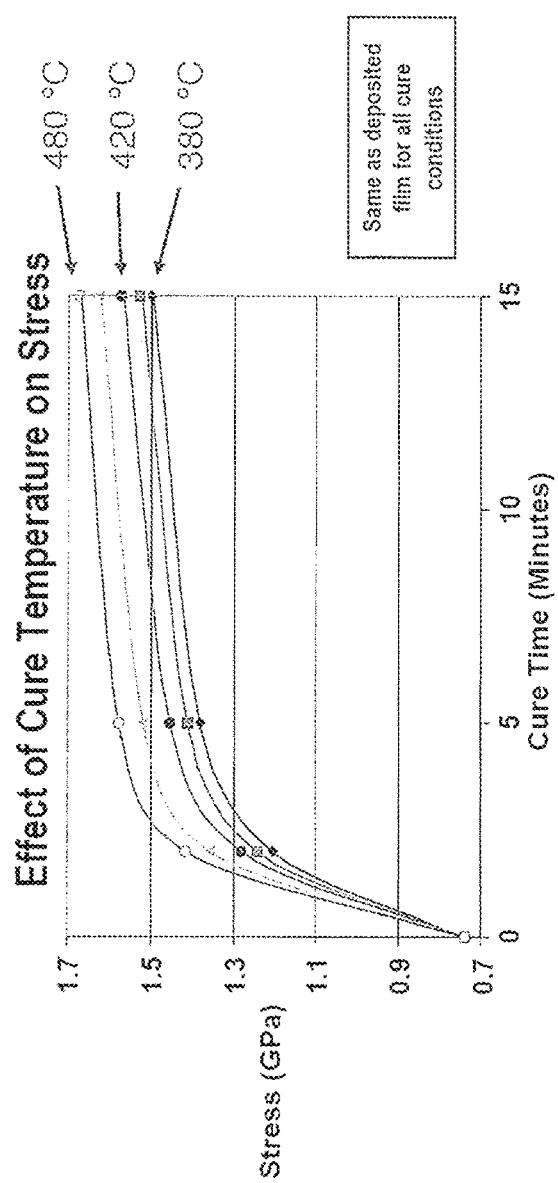
FIG. 16 shows the effect of cure temperature on stress according to an embodiment of the present disclosure.

FIG. 15 shows the effect of layer thickness on film stress according to an embodiment of the present disclosure. The ultraviolet radiation exposure was 20 seconds in all cases in FIG. 15. The effect of cure temperature on stress according to an embodiment of the present disclosure is shown in FIG. 16.

Introducing stress to semiconductor channels improves channel mobility and improves source/drain performance. In scaled down semiconductor devices there is limited space to introduce stressors. However, by using stressed etch residue films as the stressor film, stress can be generated in the source and drain regions without using too much space in the semiconductor device. For an NMOS, region a tensile stress is provided to the channel by the compressive stressor film, while in a PMOS region a compressive stress is provided to the channel by the tensile stressor film. In some embodiments, the compressive stress in the compressive film in the NMOS is about −1 to about −2 GPa, and the tensile stress in the tensile film in the PMOS is about 0.7 to about 2 GPa.

According to an embodiment of the disclosure, a method for manufacturing a semiconductor device includes forming a fin structure over a substrate and forming a first gate structure over a first portion of the fin structure. A first nitride layer is formed over a second portion of the fin structure. The first nitride layer is exposed to ultraviolet radiation. Source/drain regions are formed at the second portion of the fin structure.

According to another embodiment of the disclosure, a method for fabricating a semiconductor device is provided including forming a first fin structure over a substrate. A second fin structure is formed over the substrate. A first gate structure is formed over a first portion of the first fin structure. A second gate structure is formed over a first portion of the second fin structure. A compressive film is formed over a second portion of the first fin structure. Source/drain regions are formed at the second portion of the first fin structure. A tensile film is formed over a second portion of the second fin structure. Source/drain regions are formed at the second portion of the second fin structure.

A semiconductor device includes a first fin structure and a second fin structure. A first gate structure is disposed over a first portion of the fin structure and a second gate structure disposed over a first portion of the second fin structure. A compressive film is disposed over a second portion of the first fin structure and a tensile film is disposed over a second portion of the second fin structure. Source/drain regions are formed at the second portion of the first fin structure and second portion of the second fin structure.

As one of skill in the art would recognize, some of the steps described in the above methods can be replaced or eliminated for other embodiments of the method.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a first fin structure and a second fin structure over a substrate;
    forming a first gate structure over a first portion of the first fin structure and forming a second gate structure over a first portion of the second fin structure;
    forming a compressive film over a second portion of the first fin structure;
    exposing the compressive film to ultraviolet radiation;
    forming first source/drain regions at the second portion of the first fin structure;
    forming a tensile film over a second portion of the second fin structure; and
    forming second source/drain regions at the second portion of the second fin structure,
    wherein the first source/drain regions extend along and in contact with a side surface of the compressive film and extend vertically over a top of the compressive film.

2. The method for manufacturing a semiconductor device according to claim 1, wherein the first source/drain regions at the second portion of the first fin structure comprise SiP.

3. The method for manufacturing a semiconductor device according to claim 1, wherein the second source/drain regions at the second portion of the second fin structure comprise SiGe.

4. The method for manufacturing a semiconductor device according to claim 1, further comprising:
    forming the compressive film over the second portion of the second fin structure;
    after exposing the compressive film to ultraviolet radiation, substantially removing the compressive film over the second portion of the first fin structure so that a residual portion of the compressive film remains before forming first source/drain regions at the second portion of the first fin structure;
    removing the compressive film over the second portion of the second fin structure;
    forming a dummy layer over the first fin structure;
    forming the tensile film over the first fin structure and the dummy layer;
    substantially removing the tensile film over the second portion of the second fin structure so that a residual portion of the tensile film remains before forming second source/drain regions at the second portion of the second structure; and
    removing the tensile film and the dummy layer over the second portion of the first fin structure.

5. The method for manufacturing a semiconductor device according to claim 1, wherein an NMOS FET is formed at the first fin structure, and a PMOS FET is formed at the second fin structure.

6. The method for manufacturing a semiconductor device according to claim 1, wherein the compressive film is formed over a shallow trench isolation region.

7. A semiconductor device comprising:
    a first fin structure and a second fin structure;
    a first gate structure disposed over a first portion of the fin structure and a second gate structure disposed over a first portion of the second fin structure;
    a compressive film disposed over a second portion of the first fin structure and a tensile film disposed over a second portion of the second fin structure; and
    source/drain regions formed at the second portion of the first fin structure and second portion of the second fin structure,
    wherein the source/drain regions extend along and in contact with a side surface of the compressive film and extend vertically over a top of the compressive film.

8. The semiconductor device according to claim 7, wherein the source/drain regions at the second portion of the first fin structure comprise SiP and the source/drain regions at the second portion of the second fin structure comprise SiGe.

9. The semiconductor device according to claim 7, wherein the compressive film and the tensile film comprise a nitride or an oxide.

10. The semiconductor device according to claim 9, wherein the nitride or oxide is selected from the group of silicon nitride, carbon-doped silicon nitride, carbon-doped silicon oxide, silicon oxynitride, boron nitride, and boron carbon nitride.

11. The semiconductor device according to claim 7, wherein an NMOS FET is formed at the first fin structure and a PMOS FET is formed at the second fin structure.

12. The semiconductor device according to claim 7, further comprising a shallow trench isolation region disposed between the first fin structure and the second fin structure.

13. The semiconductor device according to claim 12, wherein the compressive film is disposed over the shallow trench isolation region.

14. A semiconductor device comprising:
a first fin structure and a second fin structure;
a shallow trench isolation region disposed between the first fin structure and the second fin structure;
a first gate structure disposed over a first portion of the fin structure and a second gate structure disposed over a first portion of the second fin structure;
a compressive nitride film residue disposed over a second portion of the first fin structure and a tensile nitride film residue disposed over a second portion of the second fin structure; and
source/drain regions formed at the second portion of the first fin structure and second portion of the second fin structure,
wherein the source/drain regions extend laterally and vertically over the compressive film residue and the tensile nitride film residue, and the compressive nitride film residue and the tensile nitride film residue are disposed over the shallow trench isolation region.

15. The semiconductor device according to claim 14, wherein the source/drain regions are in direct contact with the compressive film residue.

16. The semiconductor device according to claim 14, wherein the source/drain regions at the second portion of the first fin structure comprise SiP.

17. The semiconductor device according to claim 14, wherein the source/drain regions at the second portion of the second fin structure comprise SiGe.

18. The semiconductor device according to claim 14, wherein the compressive nitride film residue comprises silicon nitride, carbon-doped silicon nitride, silicon oxynitride, boron nitride, or boron carbon nitride.

19. The semiconductor device according to claim 14, wherein an NMOS FET is formed at the first fin structure and a PMOS FET is formed at the second fin structure.

20. The semiconductor device according to claim 14, wherein the compressive nitride film residue has a compressive stress of about −1 to about −2 GPa.

* * * * *